United States Patent
Peluso

(10) Patent No.: US 7,084,713 B2
(45) Date of Patent: Aug. 1, 2006

(54) PROGRAMMABLE CAPACITOR BANK FOR A VOLTAGE CONTROLLED OSCILLATOR

(75) Inventor: Vincenzo F. Peluso, San Diego, CA (US)

(73) Assignee: Qualcomm Inc., San Diego, CA (US)

( * ) Notice: Subject to any disclaimer, the term of this patent is extended or adjusted under 35 U.S.C. 154(b) by 46 days.

(21) Appl. No.: 11/043,385

(22) Filed: Jan. 25, 2005

(65) Prior Publication Data

US 2005/0212614 A1   Sep. 29, 2005

Related U.S. Application Data

(60) Provisional application No. 60/557,782, filed on Mar. 29, 2004.

(51) Int. Cl.
H03B 1/00 (2006.01)
H03B 5/00 (2006.01)
H03B 5/12 (2006.01)

(52) U.S. Cl. ...................................... 331/179

(58) Field of Classification Search .............. 331/36 C, 331/117 R, 117 FE, 117 D, 167, 177 V, 179

See application file for complete search history.

(56) References Cited

U.S. PATENT DOCUMENTS

| 5,180,998 | A | 1/1993 | Willems | 333/164 |
| 6,172,576 | B1 | 1/2001 | Endo et al. | 331/116 |
| 6,226,506 | B1 | 5/2001 | Welland et al. | 455/260 |
| 6,889,036 | B1 * | 5/2005 | Ballweber et al. | 455/292 |
| 7,002,393 | B1 * | 2/2006 | Yeh | 327/337 |

* cited by examiner

*Primary Examiner*—David Mis
(74) *Attorney, Agent, or Firm*—Philip R Wadsworth; Charles D Brown; Kenyon S. Jenckes

(57) ABSTRACT

A programmable capacitor bank includes multiple tuning elements. Each tuning element includes two tuning capacitors and a pass transistor that electrically connects or disconnects the capacitors to/from common nodes. For a thermometer decoded capacitor bank, the tuning capacitors for all tuning elements have equal capacitance. Each tuning element further includes at least one pull-up transistor that provides high bias voltage for the pass transistor and at least one pull-down transistor that provides low bias voltage for the pass transistor. The multiple tuning elements may be arranged in a ladder topology such that (1) the tuning elements are turned on in sequential order starting from one end of the ladder and going toward the other end of the ladder and (2) each tuning element receives biasing from a preceding tuning element and provides biasing to a succeeding tuning element. The capacitor bank may be used for VCOs and other circuits.

26 Claims, 10 Drawing Sheets

US 7,084,713 B2

PROGRAMMABLE CAPACITOR BANK FOR A VOLTAGE CONTROLLED OSCILLATOR

This application claims the benefit of provisional U.S. Application Ser. No. 60/557,782, entitled "A Thermometer Decoded Capacitor Bank for Coarse Tuning of a Voltage Controlled Oscillator," filed Mar. 29, 2004.

BACKGROUND

I. Field

The present invention relates generally to circuits, and more specifically to a digitally programmable capacitor bank for use in a voltage controlled oscillator (VCO) and other circuits.

II. Background

VCOs are an integral part of many electronics circuits and are particularly important in communication circuits. For example, VCOs are often used to generate local oscillator (LO) signals used by transmitter and receiver subsystems for frequency upconversion and downconversion, respectively. VCOs are also used to generate clock signals for synchronous circuits (e.g., flip-flops). A wireless device (e.g., a cellular phone) in a wireless communication system may employ multiple VCOs to generate LO signals for transmitter and receiver circuitry and clock signals for digital circuitry.

A VCO is typically designed to operate at a specific frequency or a specific range of frequencies. The frequency of oscillation for the VCO may deviate from a nominal design value due to various factors such as circuit component tolerances, integrated circuit (IC) process variations, circuit component aging, and so on. The oscillation frequency may also change during normal operation due to various factors such as temperature, power supply variation, and so on. The VCO typically employs one or more variable capacitors (varactors) used to adjust the oscillation frequency in order to operate the VCO at the desired frequency. The tuning range of the VCO refers to the range of oscillation frequencies achieved by varying the varactor(s) across the entire adjustment range. The VCO may be designed with a sufficiently wide tuning range to cover the expected deviation in oscillation frequency due to all of the factors noted above. However, a wide tuning range may degrade phase noise performance. Phase noise refers to short-term random frequency fluctuations of an oscillator signal and is a parameter used to describe the quality of the oscillator signal.

To reduce the tuning range requirement, a VCO may employ a programmable capacitor bank to aid with the adjustment of the oscillation frequency. The capacitor bank contains a bank of tuning capacitors that may be individually switched on or off. Each tuning capacitor reduces the oscillation frequency when switched on. The tuning capacitors typically have binary weighted capacitances, which means that the first tuning capacitor in the bank has unit capacitance and each subsequent tuning capacitor has twice the capacitance of the preceding tuning capacitor. Different total tuning capacitances, in progressively larger discrete steps, may be obtained by switching on the appropriate tuning capacitor(s). A capacitance step is the difference in tuning capacitance for two adjacent discrete steps. With binary weighted tuning capacitors, the capacitance step may vary widely depending on which capacitors in the bank are switched on. A large variation in capacitance steps can complicate frequency adjustment for the VCO and degrade phase noise performance.

There is therefore a need in the art for a programmable capacitor bank that can provide improved performance for a VCO and other circuits.

SUMMARY

A digitally programmable capacitor bank having good performance is described herein. The programmable capacitor bank includes multiple tuning elements. In an embodiment, each tuning element includes two tuning capacitors and a pass transistor coupled in series. The pass transistor is placed between the two tuning capacitors and operates to electrically connect or disconnect the capacitors from common nodes. For a thermometer decoded capacitor bank, the tuning capacitors for all tuning elements have equal (or unit) capacitance. In general, the tuning elements in the capacitor bank may have the same or different capacitances. Each tuning element further includes at least one pull-up transistor used to provide a high bias voltage for the pass transistor and at least one pull-down transistor used to provide a low bias voltage for the pass transistor. The multiple tuning elements in the capacitor bank may be arranged in a ladder topology such that the tuning elements are turned on in sequential order starting from one end of the ladder and going toward the other end of the ladder. Each tuning element may thus receive biasing from a "preceding" tuning element having the same ON or OFF state as that tuning element and provide biasing to a "succeeding" tuning element, as described below. The thermometer decoded capacitor bank and the ladder topology can provide various advantages over a binary decoded capacitor bank.

The programmable capacitor bank described herein may be used for various circuits such as VCOs, tunable filters, digital-to-analog converters (DACs), and so on. Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

A VCO may be implemented with various designs known in the art. Some VCO designs are more suitable for radio frequency (RF), some VCO designs are more suitable for fabrication on an IC, some VCO designs can provide better phase noise performance, and so on. Some exemplary VCO designs are described below.

Figure 1A:
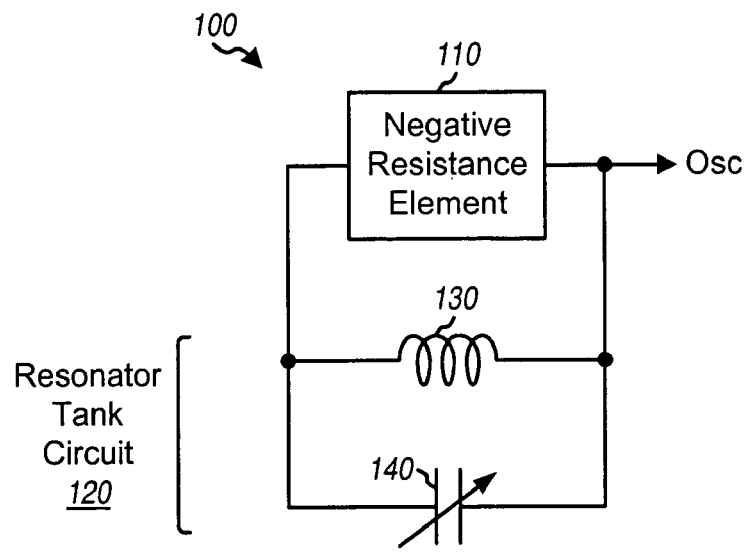
FIGS. 1A and 1B show two VCO designs.

FIG. 1A shows a schematic diagram of a VCO 100 for a first design. VCO 100 includes a negative resistance element 110 and a resonator tank circuit 120, which is composed of an inductor 130 and an adjustable capacitor 140. Negative resistance element 110 provides signal gain (or equivalently, negative resistance) needed for oscillation. Negative resistance element 110 and resonator tank circuit 120 collectively provide a 360° phase shift needed for oscillation. VCO 100 provides an oscillator signal (Osc) having a fundamental frequency of $f_{osc}$. The oscillation frequency $f_{osc}$ is determined predominantly by the inductance (L) of inductor 130 and the capacitance (C) of capacitor 140 and may be expressed as:

$$f_{osc} = \frac{1}{2\pi\sqrt{LC}}. \qquad \text{Eq (1)}$$

Figure 1B:
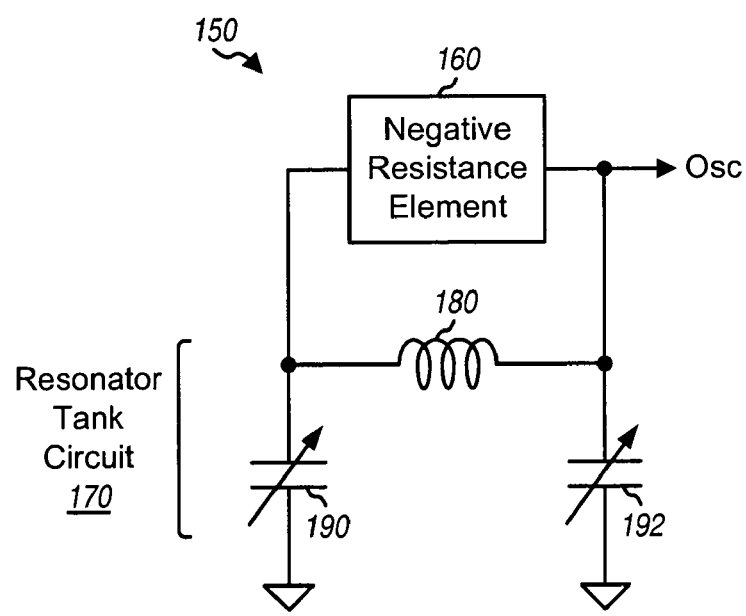

FIG. 1B shows a schematic diagram of a VCO 150 for a second design. VCO 150 includes a negative resistance element 160 and a resonator tank circuit 170, which is composed of an inductor 180 and adjustable capacitors 190 and 192. Negative resistance element 160 provides the negative resistance needed for oscillation. Negative resistance element 160 and resonator tank circuit 170 collectively provide the phase shift needed for oscillation. The oscillation frequency $f_{osc}$ is determined predominantly by the values of inductor 180 and capacitors 190 and 192, as shown in equation (1).

FIGS. 1A and 1B show two exemplary VCO designs. Other designs may also be used for the VCO. For simplicity, FIGS. 1A and 1B show only the basic circuit components of VCOs 100 and 150. A VCO typically includes other support circuitry to provide biasing, frequency control, and so on, which is not shown in FIGS. 1A and 1B.

VCOs 100 and 150 may be implemented in various manners and fabricated with various IC process technologies such as complementary metal-oxide semiconductor (CMOS), bipolar junction transistor (BJT), bipolar-CMOS (BiCMOS), silicon germanium (SiGe), gallium arsenide (GaAs), and so on.

Figure 2:
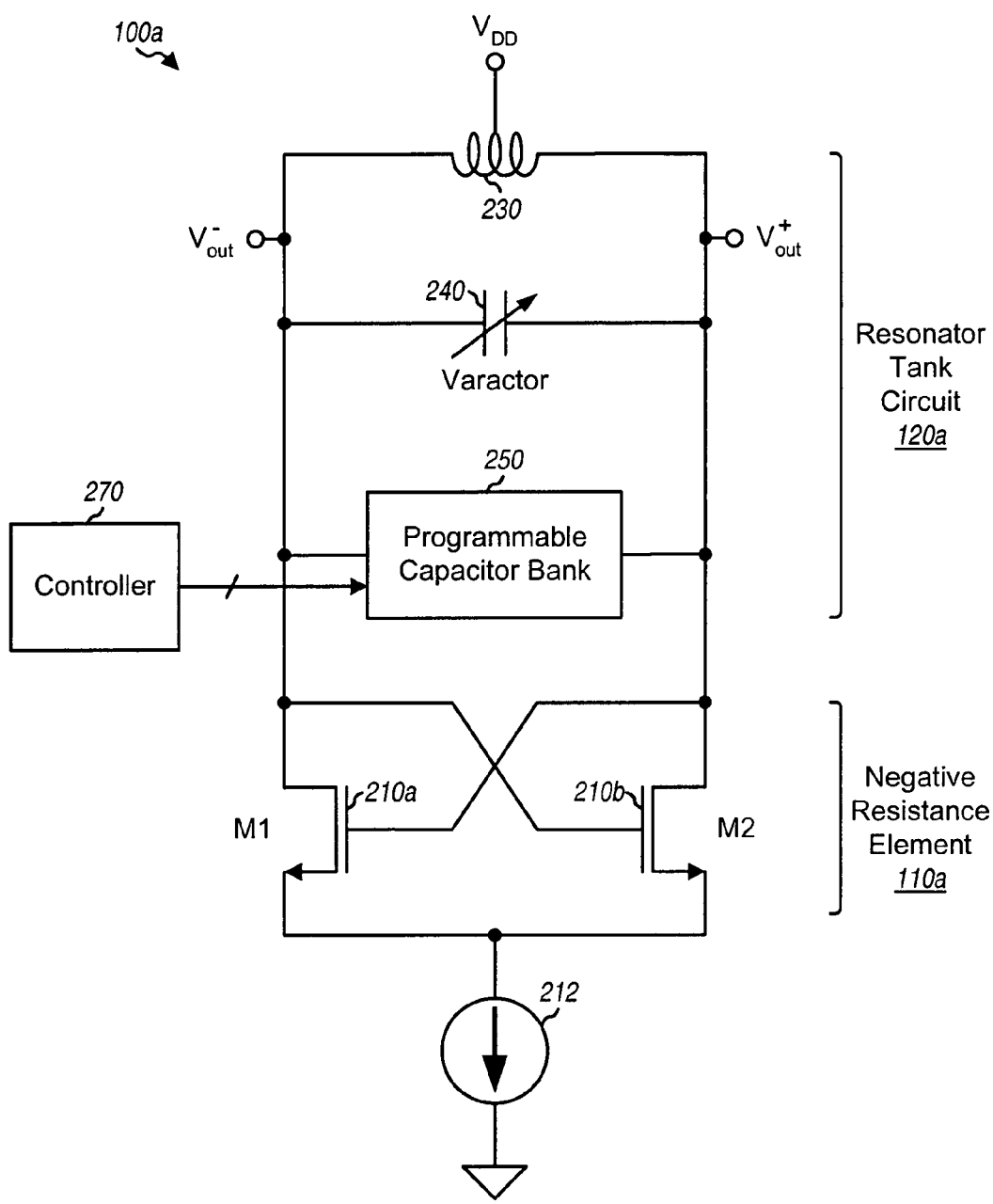
FIG. 2 shows an exemplary CMOS VCO design.

FIG. 2 shows a schematic diagram of a VCO 100a, which is an exemplary CMOS design for VCO 100 in FIG. 1A. VCO 100a includes a negative resistance element 110a and a resonator tank circuit 120a, which are an embodiment of negative resistance element 110 and resonator tank circuit 120, respectively, in FIG. 1A. VCO 100a may be fabricated on a CMOS IC.

For the embodiment shown in FIG. 2, negative resistance element 110a is composed of two N-channel MOS (N-MOS) transistors 210a and 210b. Transistor 210a has its source coupled to a current source 212, its drain coupled to a node $V_{out}^-$, and its gate coupled to the drain of transistor 210b. Transistor 210b has its source coupled to current source 212, its drain coupled to a node $V_{out}^+$, and its gate coupled to the drain of transistor 210a. Transistor 210a forms a first inverting amplifier, and transistor 210b forms a second inverting amplifier. The two inverting amplifiers are cross-coupled such that the output of one inverting amplifier couples to the input of the other inverting amplifier. Nodes $V_{out}^+$ and $V_{out}^-$ represent a differential output of VCO 100a. Current source 212 provides bias current for transistors 210a and 210b.

Resonator tank circuit 120a is composed of an inductor 230, a variable capacitor (varactor) 240, and a programmable capacitor bank 250, all of which couple in parallel and between nodes $V_{out}^+$ and $V_{out}^-$. Inductor 230 and varactor 240 may be fabricated on-chip or implemented with external circuit components. Inductor 230 has a center tap that couples to a power supply $V_{DD}$. Power is thus provided to transistors 210a and 210b via inductor 230. Varactor 240 may be adjusted based on an analog control voltage to obtain the desired oscillation frequency for VCO 100a. Varactor 240 may be used to (1) account for frequency drift due to variations in temperature, power supply, and so on, and (2) track the input frequency of a received RF signal. Varactor 240 may comprise multiple varactors, which may be coupled in series or parallel, to obtain a wider range of capacitance and thus a wider tuning range for VCO 110a.

Programmable capacitor bank 250 may be adjusted in discrete steps to vary the oscillation frequency of VCO 100a. Capacitor bank 250 may be used to reduce the tuning range requirement of varactor 240, which may then improve phase noise performance. Capacitor bank 250 may also be used to select different operating frequencies or different operating frequency bands. A controller 270 provides an L-bit control signal S[1 . . . L] for capacitor bank 250, where L>1.

FIG. 2 shows a specific CMOS VCO design. Numerous other designs may also be used for the VCO. Each of the elements of the VCO may also be implemented in other manners. For example, negative resistance element 110a may be designed with different circuits than that shown in FIG. 2.

Figure 3:
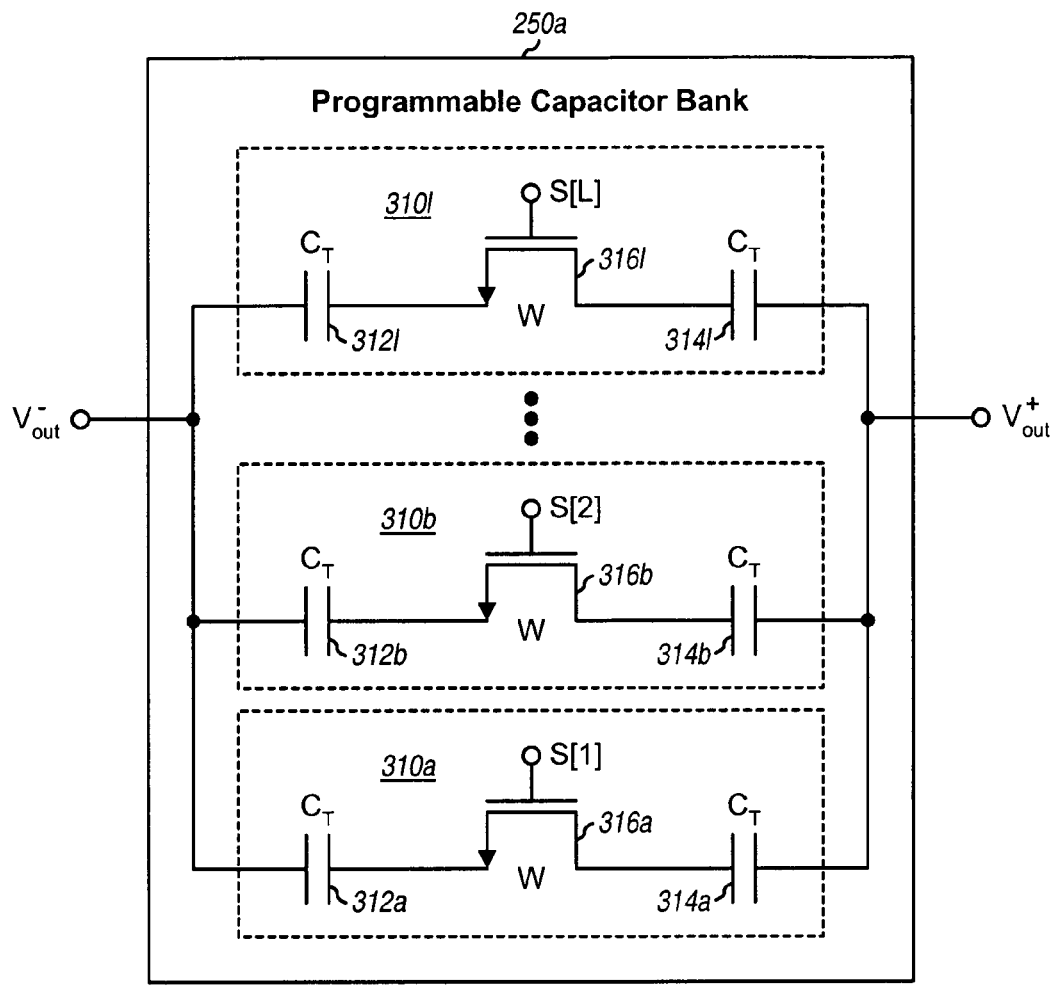
FIG. 3 shows a programmable capacitor bank.

FIG. 3 shows a schematic diagram of programmable capacitor bank 250 for VCO 110a. Capacitor bank 250 comprises a bank of L tuning elements 310a through 310l. Each tuning element 310 is controlled by a respective S[x] control signal from controller 270, where x=1 . . . L. Each tuning element 310 includes tuning capacitors 312 and 314 and an N-MOS pass transistor 316, all of which are coupled in series and between nodes $V_{out}^+$ and $V_{out}^-$. Tuning capacitors 312 and 314 may be implemented as metal insulator metal (MIM) capacitors. Pass transistor 316 is placed in the middle of tuning capacitors 312 and 314 and operates as a switch to either electrically connect or disconnect these capacitors to/from nodes $V_{out}^+$ and $V_{out}^-$. With this configuration, a minimal voltage swing exists across pass transistor 316 when switched on. Pass transistor 316 receives the S[x] control signal that enables or disables the pass transistor. When pass transistor 316 is enabled, the signal path through tuning capacitors 312 and 314 is closed, and these capacitors are connected between nodes $V_{out}^+$ and $V_{out}^-$ and directly affect the oscillation frequency of VCO 100a.

For the embodiment shown in FIG. 3, the L tuning elements 310a through 310l are implemented with thermometer decoding, which may also be called linear decoding. For thermometer decoding, tuning capacitors 312 and 314 for each of the L tuning elements have the same unit capacitance of $C_T$. Each tuning element 310 thus provides the same tuning capacitance when enabled, and the total tuning capacitance $C_{total}$ is proportional to the number of tuning elements that is enabled.

For binary decoding, capacitors 312a and 314a for tuning element 310a would have capacitance of $C_T$, capacitors 312b and 314b for tuning element 310b would have capacitance of $2C_T$, and so on, and capacitors 312l and 314l for tuning element 310l would have capacitance of $2^{L-1} \cdot C_T$. For binary decoding, tuning element 310a is for the least significant bit (LSB) and has the smallest capacitance, and tuning element 310l is for the most significant bit (MSB) has the largest capacitance.

In general, the L tuning elements 310a through 310l of capacitor bank 250 may have the same capacitance or different capacitances. For example, the L tuning elements may have individually varying capacitances. If the capacitor bank is used in a VCO, then the oscillation frequency is inversely related to the square root of capacitance, as shown in equation (1). If the tuning elements have equal capacitances, then the VCO would have non-equal frequency steps due to the one over square root relationship. The tuning elements may be designed with different capacitances, e.g., to achieve equal frequency steps for the VCO with these tuning elements.

For simplicity, FIG. 3 shows only the basic circuit components for programmable capacitor bank 250. Other circuitry for biasing and controlling the pass transistors is not shown in FIG. 3.

Figure 4:
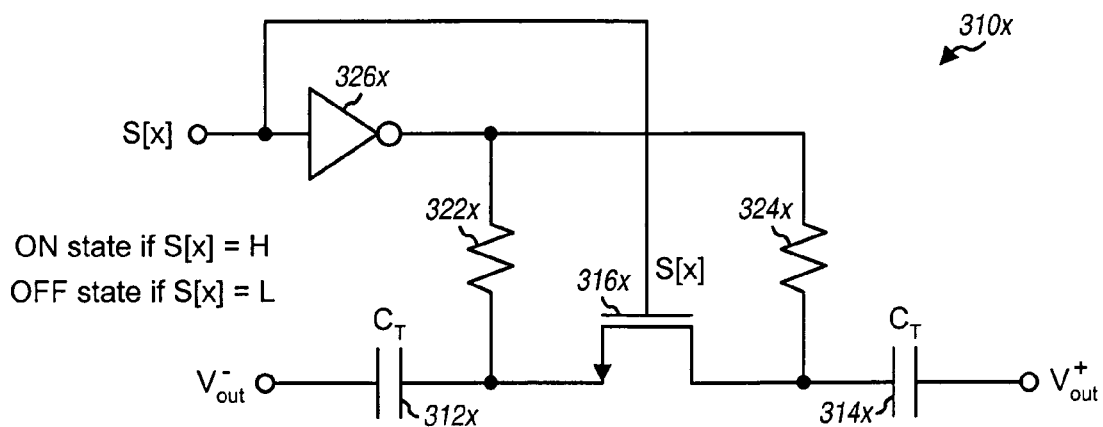
FIG. 4 shows a tuning element within the programmable capacitor bank.

FIG. 4 shows a schematic diagram of a tuning element 310x, which may be used for each of the L tuning elements 310a through 310l in FIG. 3. Tuning element 310x includes tuning capacitors 312x and 314x and pass transistor 316x, which are coupled in series and between nodes $V_{out}^+$ and $V_{out}^-$. Tuning element 310x further includes resistors 322x and 324x and an inverter 326x. Resistors 322x and 324x have one end coupled to the output of inverter 326x and the other end coupled to the source and drain, respectively, of pass transistor 316x. Since pass transistor 316x is used as a switch, the source and drain are interchangeable and may be considered as simply two channel terminals for the transistor. Resistors 322x and 324x provide biasing for pass transistor 316x. Inverter 326x receives the S[x] control signal and drives resistors 322x and 324x. The S[x] control signal also drives the gate of pass transistor 316x.

Tuning element 310x operates as follows. When the S[x] control signal is at logic high (e.g., $V_{DD}$), the gate of pass transistor 316x is at logic high, and the output of inverter 326x and resistors 322x and 324x are at logic low (e.g., $V_{SS}$). Pass transistor 316x is turned on, and tuning capacitors 312x and 314x are switched in between nodes $V_{out}^+$ and $V_{out}^-$. Conversely, when the S[x] control signal is at logic low, the gate of pass transistor 316x is at logic low, and the output of inverter 326x and resistors 322x and 324x are at logic high. Pass transistor 316x is turned off and tuning capacitors 312x and 314x are floating and switched out of nodes $V_{out}^+$ and $V_{out}^-$. The source and drain junctions of pass transistor 316x are reverse biased when the pass transistor is turned off. This reverse bias voltage ensures that pass transistor 316x is fully turned off and further reduces parasitic junction capacitance of the pass transistor in the OFF state.

For the design shown in FIG. 4, the source and drain of pass transistor 316x are biased to logic low in the ON state and to logic high in the OFF state by resistors 322x and 324x. This biasing ensures a low junction capacitance in the OFF state. One pair of resistors 322x and 324x may be used for each of the L tuning elements 310a through 310l in FIG. 3. For a binary decoded capacitor bank, L may be a relatively small value, and the 2L resistors for the L tuning elements may be fabricated in an area of reasonable size on an IC die. However, L may be a relatively large value for a thermometer decoded capacitor bank. The 2L resistors would require a relatively large area to fabricate on an IC die and would represent a huge area penalty for using the thermometer decoded capacitor bank.

The bank of L tuning elements 310a through 310l may be configured in a ladder topology. For a thermometer decoded capacitor bank, the L tuning elements may be enabled in a sequential order starting from a first end of the ladder and concluding at a second end of the ladder. As many tuning elements are enabled as needed in order to obtain the desired total tuning capacitance $C_{total}$. If $0<C_{total}<L\cdot C_T$, then a first series of tuning elements 310a through 310i starting from the first end of the ladder may be turned on, and a second series of tuning elements 310j through 310L finishing at the second end of the ladder may be turned off. Tuning elements 310i and 310j are adjacent to each other and may be any ones of the L tuning elements, depending on the total tuning capacitance $C_{total}$.

Figure 5:
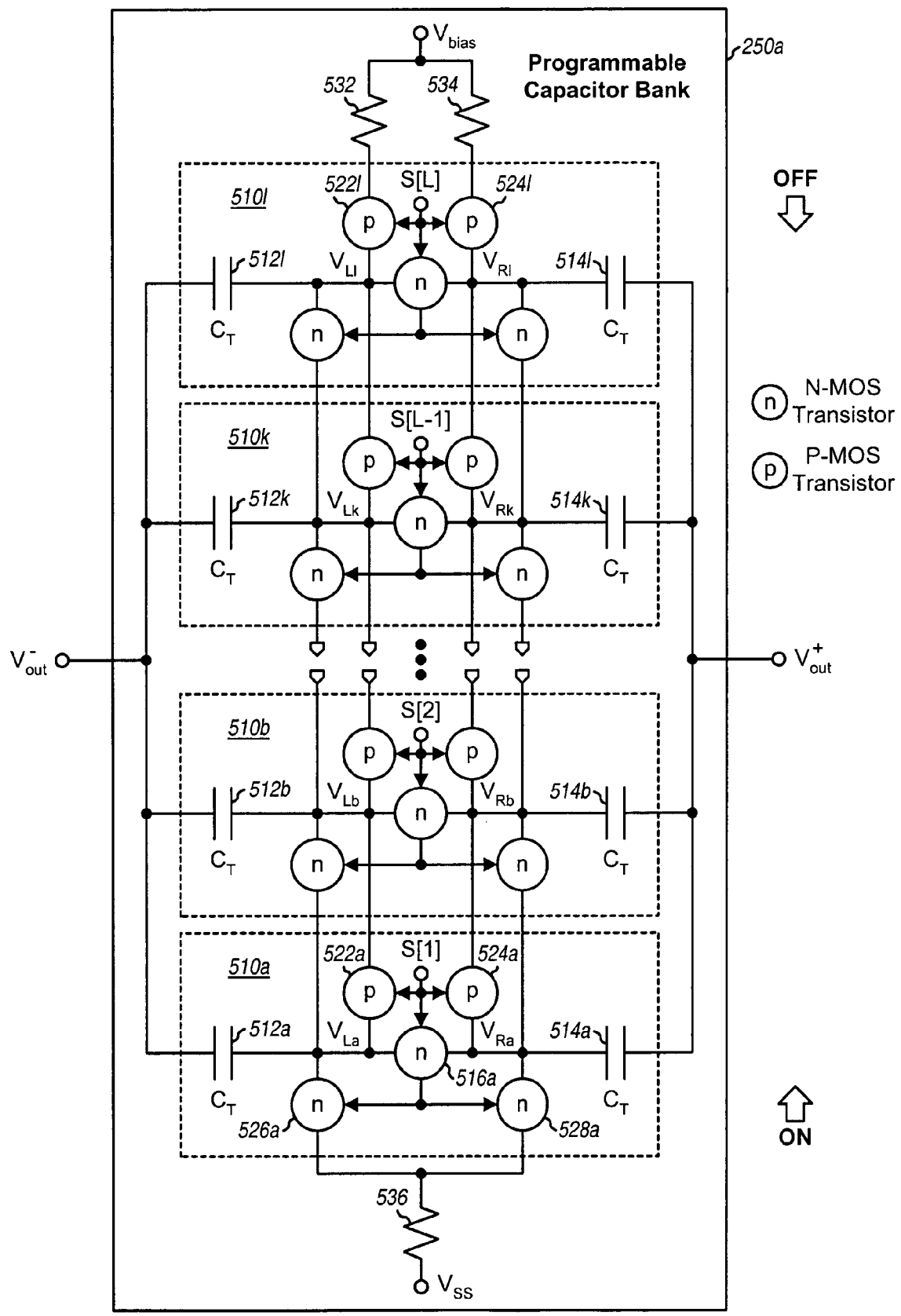
FIGS. 5, 7A, 7B, and 7C show four embodiments of a programmable capacitor bank with tuning elements arranged in a ladder topology.

FIG. 5 shows a schematic diagram of a programmable capacitor bank 250a, which is an embodiment of programmable capacitor bank 250 for VCO 110a. Capacitor bank 250a comprises a bank of L tuning elements 510a through 510l that are arranged in a ladder topology. Each tuning element 510 includes tuning capacitors 512 and 514 and an N-MOS pass transistor 516, all of which are coupled in series and between nodes $V_{out}^+$ and $V_{out}^-$. Tuning capacitors 512 and 514 and pass transistor 516 for each tuning element 510 correspond to, and operate in the same manner as, tuning capacitors 312 and 314 and pass transistor 316, respectively, for each tuning element 310 in FIG. 3.

For the embodiment shown in FIG. 5, each tuning element 510 further includes two P-channel MOS (P-MOS) pull-up transistors 522 and 524 (which are represented by circles enclosing the letter "p") and two N-MOS pull-down transistors 526 and 528 (which are represented by circles enclosing the letter "n"). For each P-MOS pull-up transistor represented by a circle with the letter "p", the source is at the top of the circle, the gate is at the side of the circle, and the drain is at the bottom of the circle. For each N-MOS pull-down transistor represented by a circle with the letter "n", the source is at the bottom of the circle, the gate is at the side of the circle, and the drain is at the top of the circle. Pull-up transistors 522 and 524 of each tuning element 510 provide biasing to disable the tuning element. Pull-down transistors 526 and 528 of each tuning element 510 provide biasing to enable the tuning element. Resistors 532 and 534 couple to a high bias voltage $V_{bias}$ and further couple to the sources of pull-up transistors 522l and 524l, respectively, for the top/last tuning element 510l in the ladder topology. The high bias voltage may be $V_{DD}$ or a voltage lower than $V_{DD}$. A high bias voltage of $V_{DD}$ allows the junction diodes of P-MOS transistors 522 and 524 to forward bias when the VCO swings above $V_{DD}$. A high bias voltage of less than $V_{DD}$ avoids this forward bias phenomenon. A resistor 536 has one end coupled to a low bias voltage (e.g., $V_{SS}$) and the other end coupled to the sources of pull-down transistors 526a and 528a for the bottom/first tuning element 510a in the ladder topology.

The ladder topology provides certain advantages such as good quality (Q) factor for the capacitor bank. Consequently, the Q factor of the resonator tank that uses the capacitor bank is improved. The better resonator tank Q results in lower noise and/or lower power for the VCO.

Figure 6:
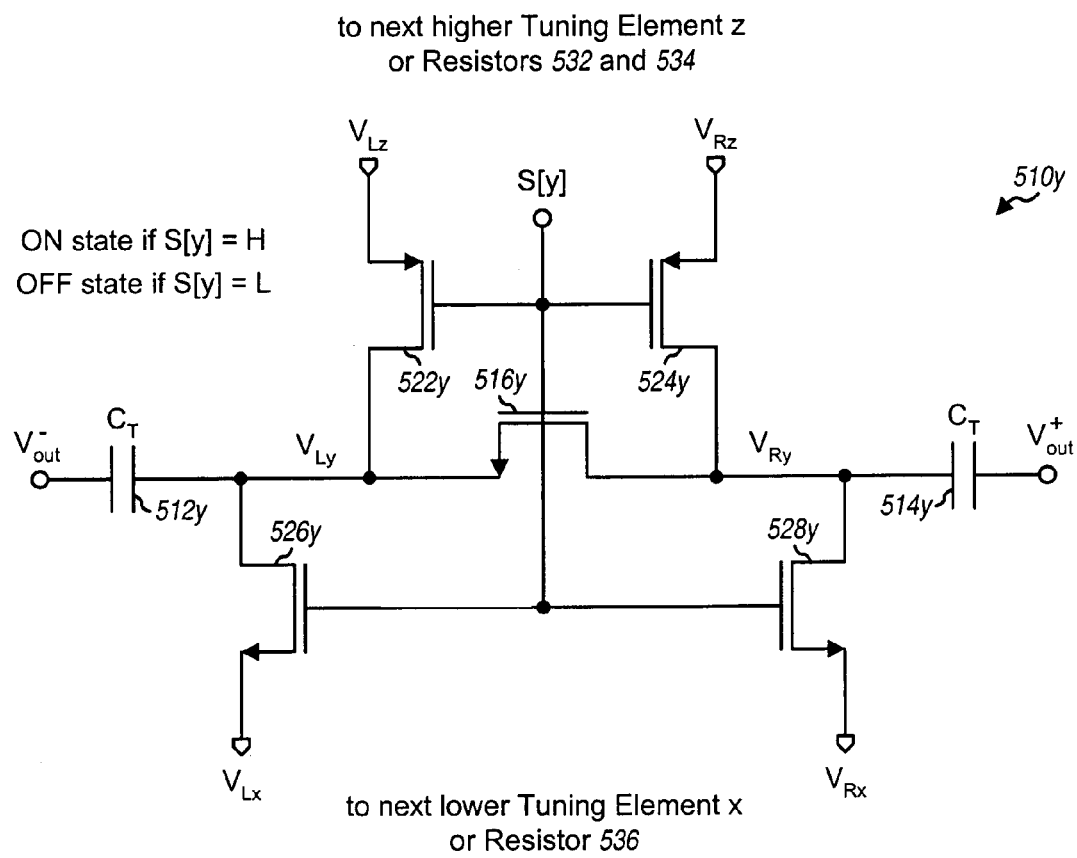
FIG. 6 shows a tuning element with biasing provided by transistors.

FIG. 6 shows a schematic diagram of a tuning element 510y, which may be used for each of the L tuning elements 510a through 510l in FIG. 5. Tuning element 510y includes tuning capacitors 512y and 514y and pass transistor 516y, which are coupled in series and between nodes $V_{out}^+$ and $V_{out}^-$. Tuning element 510y further includes two P-MOS pull-up transistors 522y and 524y and two N-MOS pull-down transistors 526y and 528y. Pull-up transistors 522y and

524y have sources that couple to nodes $V_{Lz}$ and $V_{Rz}$, respectively, gates that couple together and receive the S[x] control signal, and drains that couple to internal nodes $V_{Ly}$ and $V_{Ry}$, respectively, within tuning element 510y. Pull-down transistors 526y and 528y have sources that couple to nodes $V_{Lx}$ and $V_{Rx}$, respectively, gates that couple together and receive the S[x] control signal, and drains that couple to internal nodes $V_{Ly}$ and $V_{Ry}$, respectively. Pull-up transistors 522y and 524y and pull-down transistors 526y and 528y are only used to provide biasing and may thus be implemented with small transistor sizes.

Nodes $V_{Ly}$ and $V_{Ry}$ correspond to the source and drain, respectively, of pass transistor 516y for tuning element 510y. Nodes $V_{Lx}$ and $V_{Rx}$ correspond to the source and drain, respectively, of the pass transistor for the tuning element immediately below tuning element 510y in the ladder topology. If tuning element 510y is the bottom/first tuning element, then nodes $V_{Lx}$ and $V_{Rx}$ correspond to resistor 536. Nodes $V_{Lz}$ and $V_{Rz}$ correspond to the source and drain, respectively, of the pass transistor for the tuning element immediately above tuning element 510y in the ladder topology. If tuning element 510y is the top/last tuning element, then nodes $V_{Lz}$ and $V_{Rz}$ correspond to resistors 532 and 534, respectively.

Tuning element 510y operates as follows. A logic high on the S[x] control signal enables tuning element 510y, and a logic low disables tuning element 510y. If the S[x] control signal is at logic high, then pull-down transistors 526y and 528y are enabled since nodes $V_{Lx}$ and $V_{Rx}$ are at logic low for the reason described below. The enabled pull-down transistors 526y and 528y bring nodes $V_{Ly}$ and $V_{Ry}$ to logic low. Pass transistor 516y is then enabled by the logic high at its gate and the logic low at its source and drain. The logic high on the S[x] control signal also disables pull-up transistors 522y and 524y.

Conversely, if the S[x] control signal is at logic low, then pull-up transistors 522y and 524y are enabled since nodes $V_{Lz}$ and $V_{Rz}$ are at logic high for the reason described below. The enabled pull-up transistors 522y and 524y bring nodes $V_{Ly}$ and $V_{Ry}$ to logic high. Pass transistor 516y is then disabled by the logic low at its gate and the logic high at its source and drain. The logic low on the S[x] control signal also disables pull-down transistor 526y and 528y.

The S[x] control signal thus enables either pull-up transistors 522y and 524y or pull-down transistors 526y and 528y at any given moment. If pull-up transistors 522y and 524y are enabled, then nodes $V_{Ly}$ and $V_{Ry}$ are pulled up to logic high and provide logic high biasing on nodes $V_{Lx}$ and $V_{Rx}$ for the next tuning element immediately below tuning element 510y. Conversely, if pull-down transistors 526y and 528y are enabled, then nodes $V_{Ly}$ and $V_{Ry}$ are pulled down to logic low and provide logic low biasing on nodes $V_{Lz}$ and $V_{Rz}$ for the next tuning element immediately above tuning element 510y.

Referring back to FIG. 5, for the ladder topology, the tuning elements are enabled in sequential order from the bottom of the ladder to the top of the ladder. Thus, tuning element 510a is the first to be enabled, tuning element 510b is the second to be enabled, and so on, and tuning element 510l is the last to be enabled. The first series of tuning elements that is turned on runs from the bottom of the ladder toward the top of the ladder. Each of these tuning elements has its pull-down transistors turned on and its pull-up transistors turned off. The second series of tuning elements that is turned off runs from the top of the ladder toward the bottom of the ladder. Each of these tuning elements has its pull-up transistors turned on and its pull-down transistors turned off.

If tuning element 510y is enabled, where y=1 ... L, then all tuning elements (if any) below tuning element 510y are also enabled and have their pull-down transistors turned on, which then provides logic low bias to the pull-down transistors for tuning element 510y. The pull-down transistors for tuning element 510y are also turned on and provide logic low bias to the tuning element directly above tuning element 510y.

If tuning element 510y is disabled, then all tuning elements (if any) above tuning element 510y are also disabled and have their pull-up transistors turned on, which then provides logic high bias to the pull-up transistors for tuning element 510y. The pull-up transistors for tuning element 510y are also turned on and provide logic high bias to the tuning element directly below tuning element 510y.

Each tuning element 510y, where y=1 ... L, thus receives biasing from a "preceding" tuning element having the same ON or OFF state as that tuning element 510y, which may be either above or below tuning element 510y. Each tuning element 510y also provides biasing to a "succeeding" tuning element having the same ON or OFF state as that tuning element 510y, which may also be above or below tuning element 510y. A tuning element that is in the ON state receives biasing from pull-down transistors in a preceding tuning element that is immediately below and provides biasing to pull-down transistors in a succeeding tuning element that is immediately above. A tuning element that is in the OFF state receives biasing from pull-up transistors in a preceding tuning element that is immediately above and provides biasing to pull-up transistors in a succeeding tuning element that is immediately below.

Figure 7A:
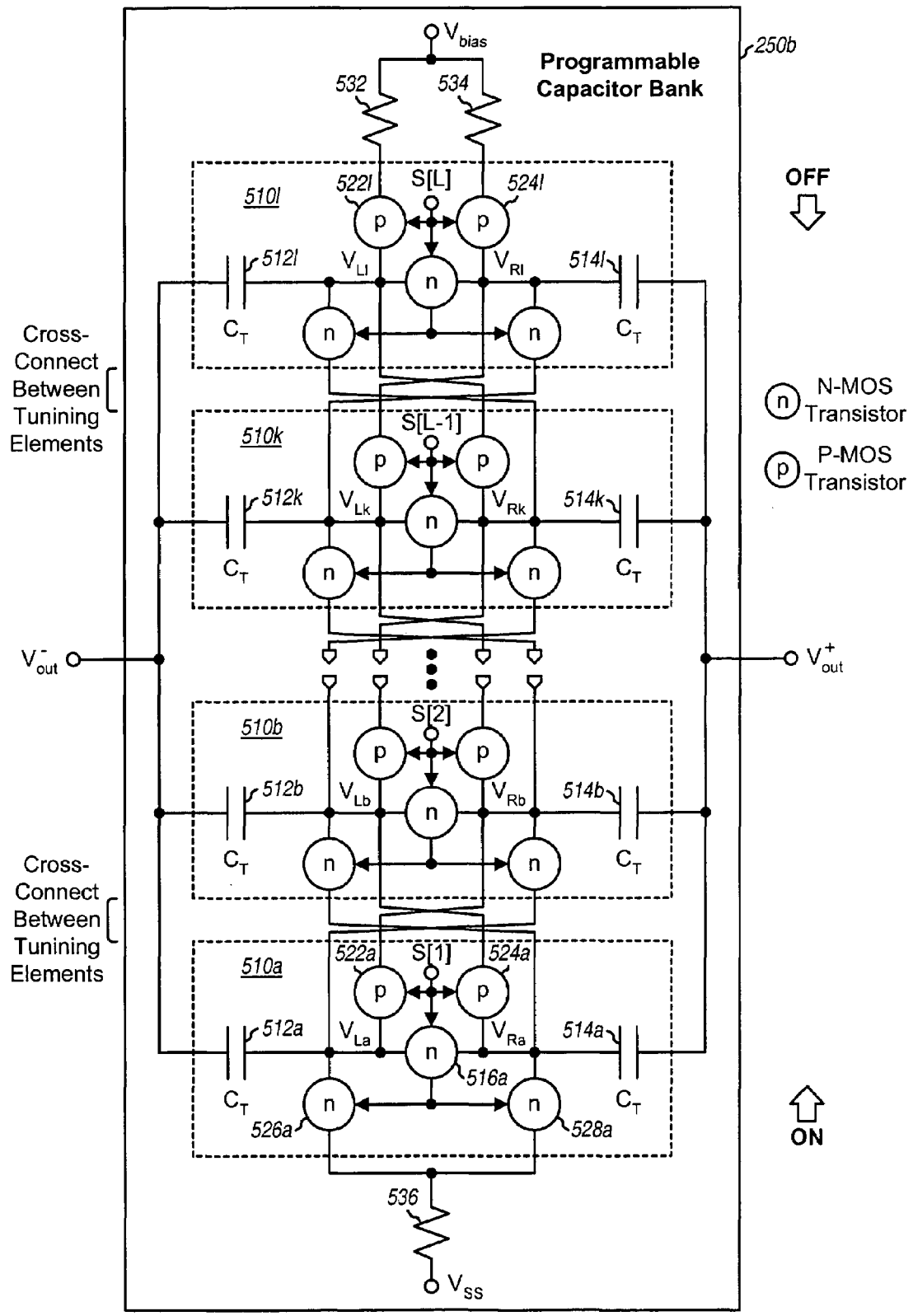

FIG. 7A shows a schematic diagram of a programmable capacitor bank 250b, which is another embodiment of programmable capacitor bank 250 for VCO 110a. Capacitor bank 250b comprises a bank of L tuning elements 510a through 510l that are arranged in a ladder topology, similar to that shown in FIG. 5. Each tuning element 510 may be implemented as shown in FIG. 6. Capacitor bank 250b operates in similar manner as capacitor bank 250a in FIG. 5.

For the embodiment shown in FIG. 7A, the sources of pull-up transistors 522 and 524 for the left side and right side, respectively, of each tuning element cross-couple to internal nodes $V_R$ and $V_L$, respectively, in the tuning element directly above. For example, the sources of pull-up transistors 522a and 524a in tuning element 510a couple to nodes $V_{Rb}$ and $V_{Lb}$, respectively, in tuning element 510b directly above. The sources of pull-down transistors 526 and 528 for the left side and right side, respectively, of each tuning element cross-couple to internal nodes $V_R$ and $V_L$, respectively, in the tuning element directly below. For example, the sources of pull-down transistors 526b and 528b in tuning element 510b couple to nodes $V_{Ra}$ and $V_{La}$, respectively, in tuning element 510a directly below. The cross-coupling of the biasing between adjacent tuning elements may provide certain advantages (e.g., ease of routing for certain circuit layouts, better matching, and so on).

Figure 7B:
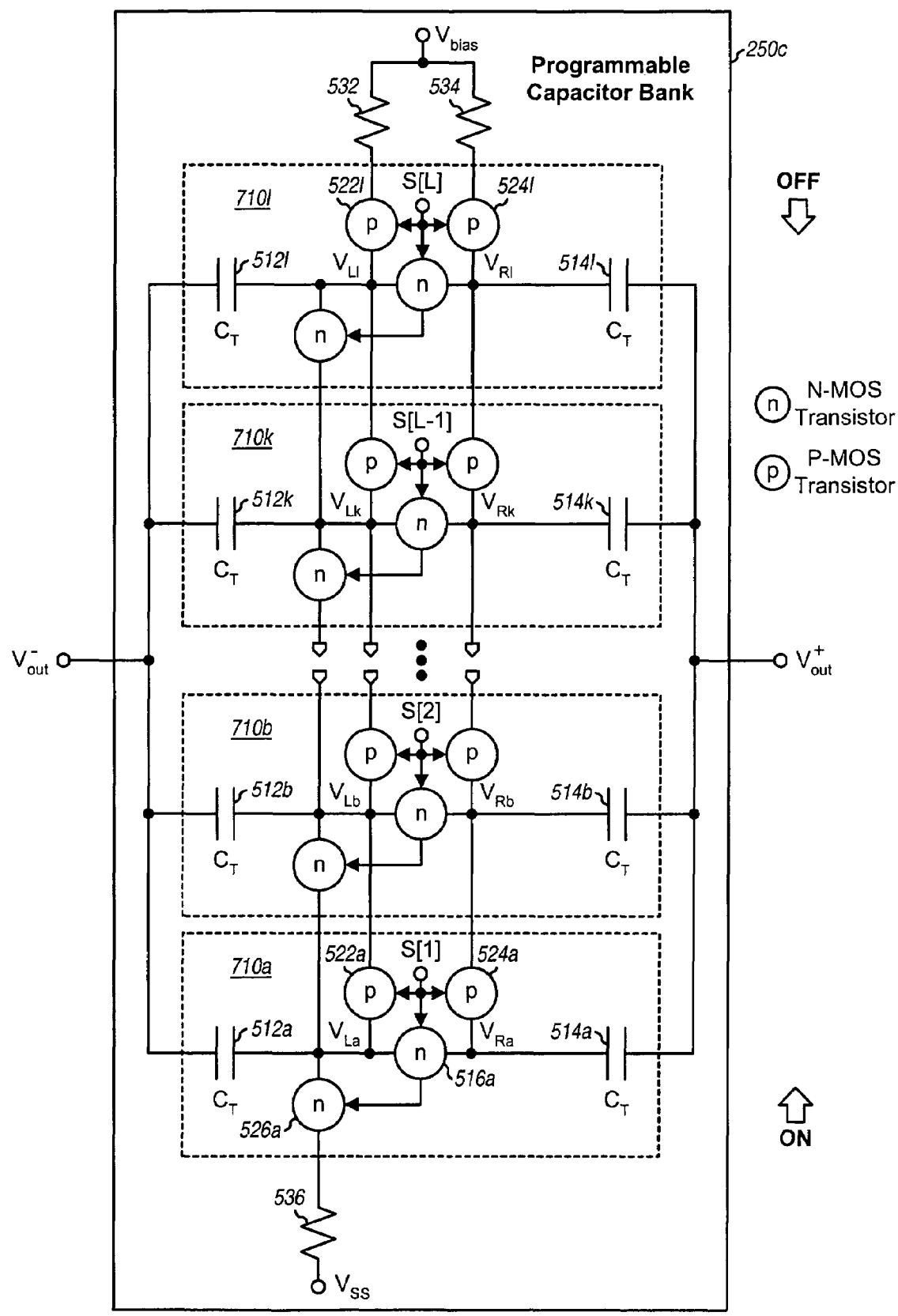

FIG. 7B shows a schematic diagram of a programmable capacitor bank 250c, which is yet another embodiment of programmable capacitor bank 250 for VCO 110a. Capacitor bank 250c comprises a bank of L tuning elements 710a through 710l that are arranged in a ladder topology. Each tuning element 710 includes all of the elements shown in FIG. 6 except for N-MOS pull-down transistor 528 on the right side. Pull-down transistor 526 for each tuning element 710 is enabled if that tuning element is in the ON state. In that case, pass transistor 516 for that tuning element is also turned on, the voltage on nodes $V_R$ and $V_L$ are approximately equal, and one pull-down transistor 526 can provide biasing to the tuning element directly above. This embodiment reduces the number of pull-down transistors used to provide biasing for pass transistors 516. Capacitor bank 250c operates in similar manner as capacitor bank 250a in FIG. 5.

Figure 7C:
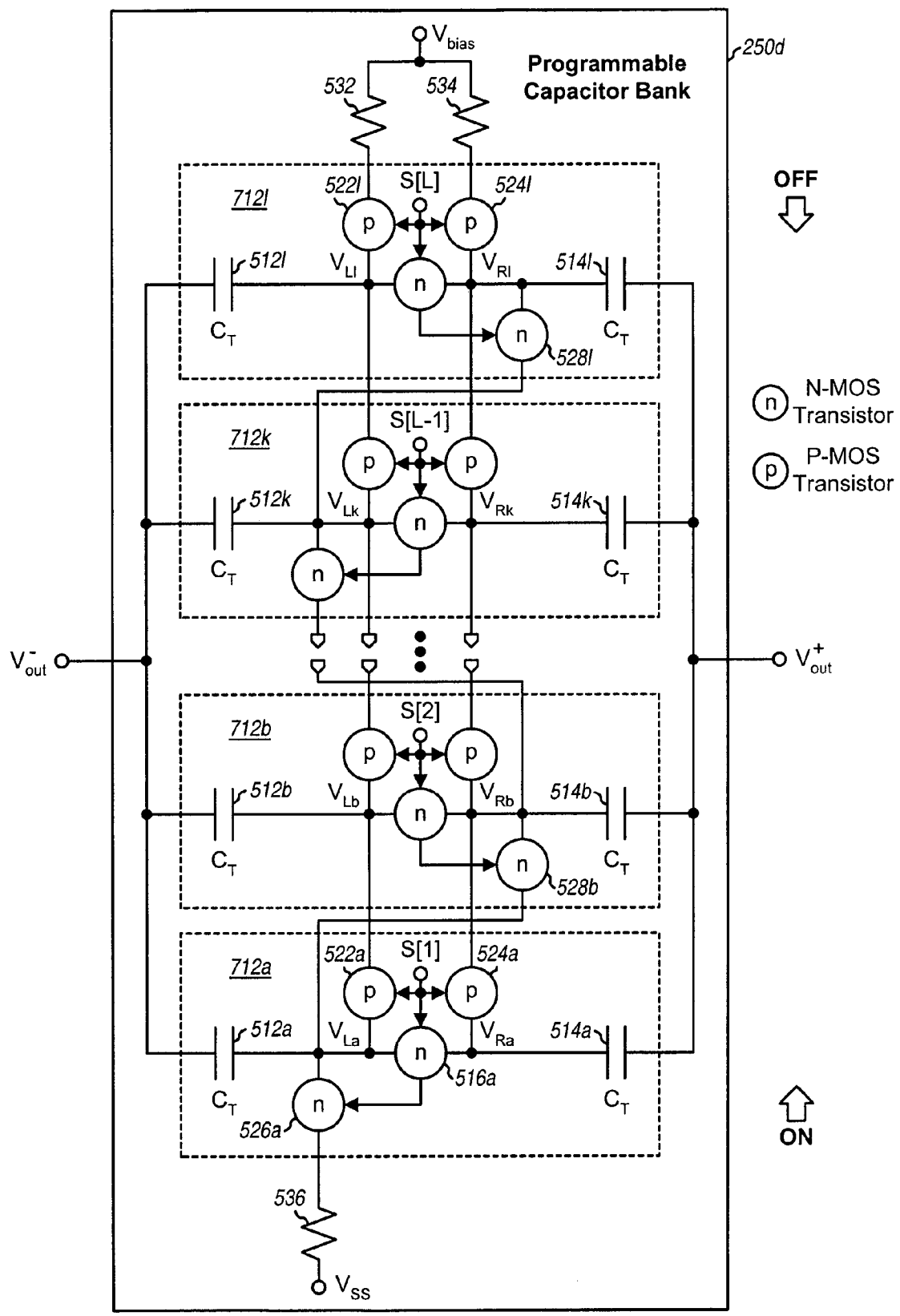

FIG. 7C shows a schematic diagram of a programmable capacitor bank 250d, which is yet another embodiment of programmable capacitor bank 250 for VCO 110a. Capacitor bank 250d comprises a bank of L tuning elements 712a through 712l that are arranged in a ladder topology. Each tuning element 712 includes all of the elements shown in FIG. 6, minus one N-MOS pull-down transistor. Every other tuning element has one pull-down transistor 526 on the left side, and each remaining tuning element has one pull-down transistor 528 on the right side. The pull-down transistors are thus staggered between the left and right sides across the ladder. The pull-down transistor for each tuning element may couple to the internal node on the opposite side in the tuning element directly below, as shown in FIG. 7C. For example, the source of pull-down transistor 528b in tuning element 712b couples to node $V_{La}$ in tuning element 712a directly below. The pull-down transistor for each tuning element may also couple to the internal node on the same side in the tuning element directly below (not shown in FIG. 7C). For example, the source of pull-down transistor 528b in tuning element 712b may couple to node $V_{Ra}$ in tuning element 712a directly below. Different inter-connections may provide different benefits for different circuit designs and/or layouts.

As indicated in FIGS. 5, 7A, 7B, and 7C, three resistors 532, 534, and 536 may be used to couple the L tuning elements 510a through 510l to the low bias voltage (e.g., logic ground $V_{SS}$) and the high bias voltage (e.g., logic high $V_{DD}$, or a voltage lower than $V_{DD}$). A fixed number of three resistors is used for the ladder topology regardless of the number of tuning elements in the ladder. In contrast, 2L resistors would be needed for a programmable capacitor bank using tuning element 310x in FIG. 4. Since a resistor occupies much more IC die area than a transistor, substantial saving in die area may be achieved with the ladder topology since only three resistors are used. This saving in die area can typically more than make up for any additional die area used to implement the thermometer decoding logic. Thus, the entire thermometer decoded capacitor bank (including resistors and transistors) and the associated control logic may be smaller in area than a comparable binary decoded capacitor bank.

Four embodiments of the programmable capacitor bank with the ladder topology have been described above in FIGS. 5, 7A, 7B, and 7C. For the ladder topology, each tuning element couples to another tuning element (if any) directly above and further couples to another tuning element (if any) directly below. In general, biasing for the pass transistors may be provided in various manners. At least one pull-up transistor is used to provide the high bias voltage (e.g., $V_{DD}$ or lower) for the pass transistor, and at least one pull-down transistor is used to provide the low bias voltage (e.g., $V_{SS}$) for the pass transistor. Two pull-up transistors are typically used for high biasing to ensure that the pass transistor is turned off. The pull-up transistor(s) and/or the pull-down transistor(s) for each tuning element couple to, and receive biasing from, at least one other tuning element. Various topologies may be used to achieve this interconnection. For example, the L tuning elements may be arranged into two or more groups, and each group of tuning elements may be coupled in a ladder topology. This may be beneficial for layout and/or other considerations.

The performance of an exemplary 5-bit thermometer decoded capacitor bank was evaluated against a comparable 5-bit binary decoded capacitor bank. The 5-bit thermometer decoded capacitor bank has 31 tuning elements, with each tuning element having two tuning capacitors and each tuning capacitor having a unit capacitance of $C_T$ femto-Farad (fF). The 5-bit binary decoded capacitor bank has five tuning elements, and the tuning capacitors for these five tuning elements have capacitance of $C_T$, $2C_T$, $4C_T$, $8C_T$, and $16C_T$. Each capacitor bank receives a tuning code that ranges from 0 through 31, with a progressively higher code value corresponding to more total tuning capacitance. A code value of 0 corresponds to the smallest total tuning capacitance of 0 fF (ideally), and a code value of 31 corresponds to the largest total tuning capacitance of $31C_T$. In a practical implementation, each tuning element that is turned off has some series (or "off") capacitance through the element. Thus, even for code value of 0, the sum of all the off capacitances may be a substantial and non-negligible capacitance.

Figure 8A:
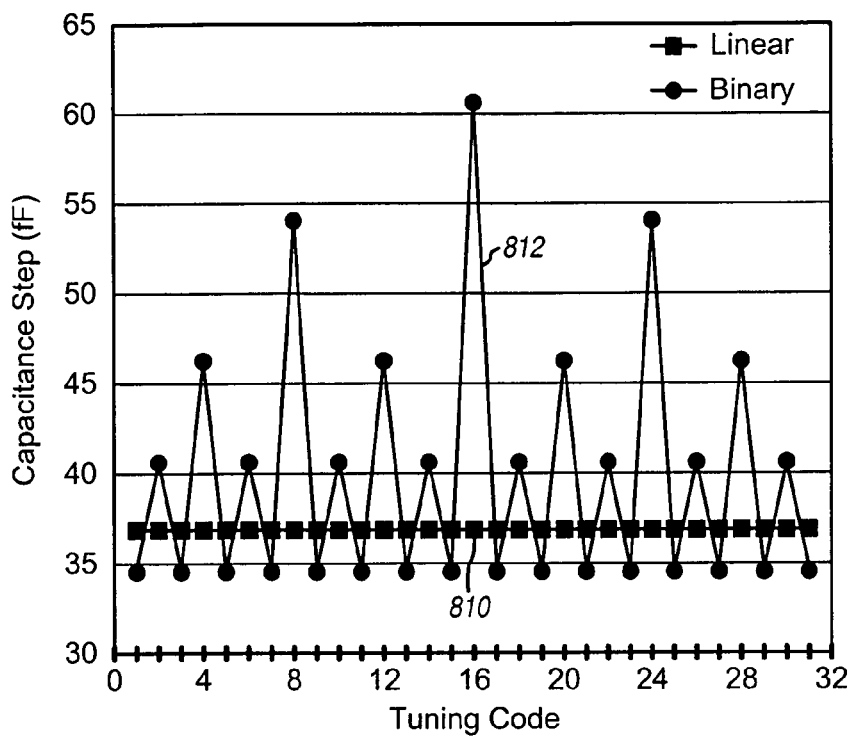
FIGS. 8A and 8B show plots of capacitance steps and quality factor (Q) for a thermometer decoded capacitor bank and a binary decoded capacitor bank.

FIG. 8A shows plots of capacitance steps for the 5-bit thermometer decoded capacitor bank and the 5-bit binary decoded capacitor bank. For each code value k ranging from 0 through 31, the total tuning capacitance $C_{total}$ (k) for that code value k is determined and subtracted from the total tuning capacitance $C_{total}$ (k−1) for a prior value k−1 to obtain the capacitance step (or change in capacitance) $\Delta C(k)$ for that code value, or $\Delta C(k) = C_{total}(k) - C_{total}(k-1)$. For an ideal capacitor bank, the capacitance step is the same for all code values, or $\Delta C(1) = \Delta C(2) = \ldots = \Delta C(31)$.

Plot 810 shows the capacitance steps for code values 1 through 31 for the 5-bit thermometer decoded capacitor bank. Plot 810 indicates that the capacitance steps for the thermometer decoded capacitor bank are very similar. Plot 812 shows the capacitance steps for code values 1 through 31 for the 5-bit binary decoded capacitor bank. Plot 812 indicates that the capacitance steps for the binary decoded capacitor bank are not constant across all code values. The largest capacitance step occurs when the MSB is switched going from 15 to 16 and is almost twice as large as the nominal capacitance step.

Differential non-linearity (DNL) is a measure of the variation in capacitance steps and is larger for the binary decoded capacitor bank than the thermometer decoded capacitor bank. The larger DNL for the binary decoded capacitor bank is due to typical implementation of this capacitor bank. Each pass transistor has parasitic capacitors (mainly diffusion area to bulk and gate overlap) that result in the tuning capacitance for a tuning element not being zero in the OFF state. To achieve the same Q for a larger tuning capacitance, the resistance of the pass transistor needs to be reduced correspondingly, as shown in equation (2). This may be achieved by implementing K pass transistors in parallel for a tuning capacitance that is K times the unit capacitance. However, in order to minimize the OFF state parasitic capacitance and at the same time reduce the non-linear capacitance coupling into the resonator tank, these K pass transistors are often implemented with shared source and drain. This results in a lumped pass transistor having less than K times the parasitic capacitance. Consequently, the total (tuning and parasitic) capacitance for this tuning element is less than K times the total (tuning and parasitic) capacitance for the tuning element with unit capacitance, thereby resulting in DNL. For the thermometer decoded capacitor bank, the tuning capacitors and pass transistor are dimensioned in the same manner for all L tuning elements, and DNL is thus inherently better.

A VCO may employ a programmable capacitor bank for coarse frequency tuning and a varactor for fine frequency tuning. The varactor is then selected to have a capacitance range that covers the largest capacitance step for all code values. A large varactor is thus needed for a large capacitance step. A large varactor is undesirable since the varactor is a non-linear capacitor that upconverts baseband noise to the resonator tank and hence degrades the phase noise of the VCO. In general, phase noise degrades (i.e., increases) with increasing varactor size. As shown in FIG. 8A, the largest capacitance step for the binary decoded capacitor bank is approximately twice the largest capacitance step for the thermometer decoded capacitor bank. The binary decoded capacitor bank thus requires a varactor that is two or more times the size as one for the thermometer decoded capacitor bank and hence has worse phase noise performance.

Figure 8B:
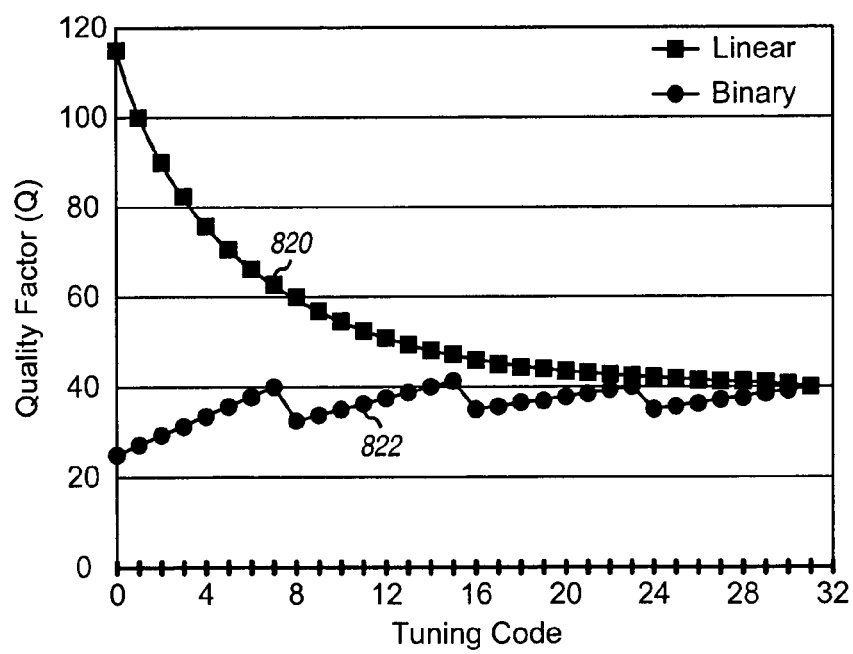

FIG. 8B shows a plot 820 of the quality factor (Q) of the 5-bit thermometer decoded capacitor bank and a plot 822 for the Q of the 5-bit binary decoded capacitor bank for all code values. From FIG. 8B, it can be seen that the minimum Q of the thermometer decoded capacitor bank is approximately equal to the maximum Q of the binary decoded capacitor bank. The higher Q for the thermometer decoded capacitor bank may also improve phase noise performance.

A thermometer decoded capacitor bank thus has some key advantages over a binary decoded capacitor bank. First, the thermometer decoded capacitor bank has less DNL than the binary decoded capacitor bank, which allows for use of a smaller varactor, which in turn may improve phase noise performance. Second, the thermometer decoded capacitor bank has higher Q than the binary decoded capacitor bank, which may again improve phase noise performance. Using the ladder topology, the thermometer decoded capacitor bank may be implemented on approximately the same die area as the binary decoded capacitor bank, so that there is no die penalty.

The programmable capacitor bank described herein may be used for various types of oscillators such as VCOs, current controlled oscillators (ICOs), voltage controlled crystal oscillators (VCXOs), and so on. The programmable capacitor bank may also be used for other types of circuit such as tunable filters, DACs, and so on. The programmable capacitor bank and VCO may be used for various types of IC, such as radio frequency ICs (RFICs) and digital ICs. The programmable capacitor bank and VCO may also be used for digital signal processors (DSPs), application specific integrated circuits (ASICs), processors, controllers, and so on.

The programmable capacitor bank and VCO described herein may be used in various systems and applications such as communication, networking, computing, consumer electronics, and so on. The programmable capacitor bank and VCO may be used in wireless communication systems such as a Code Division Multiple Access (CDMA) system, a Time Division Multiple Access (TDMA) system, a Global System for Mobile Communications (GSM) system, an Advanced Mobile Phone System (AMPS) system, Global Positioning System (GPS), a multiple-input multiple-output (MIMO) system, an orthogonal frequency division multiplexing (OFDM) system, an orthogonal frequency division multiple access (OFDMA) system, a wireless local area network (WLAN), and so on. The use of VCOs with the programmable capacitor bank for wireless communication is described below.

Figure 9:
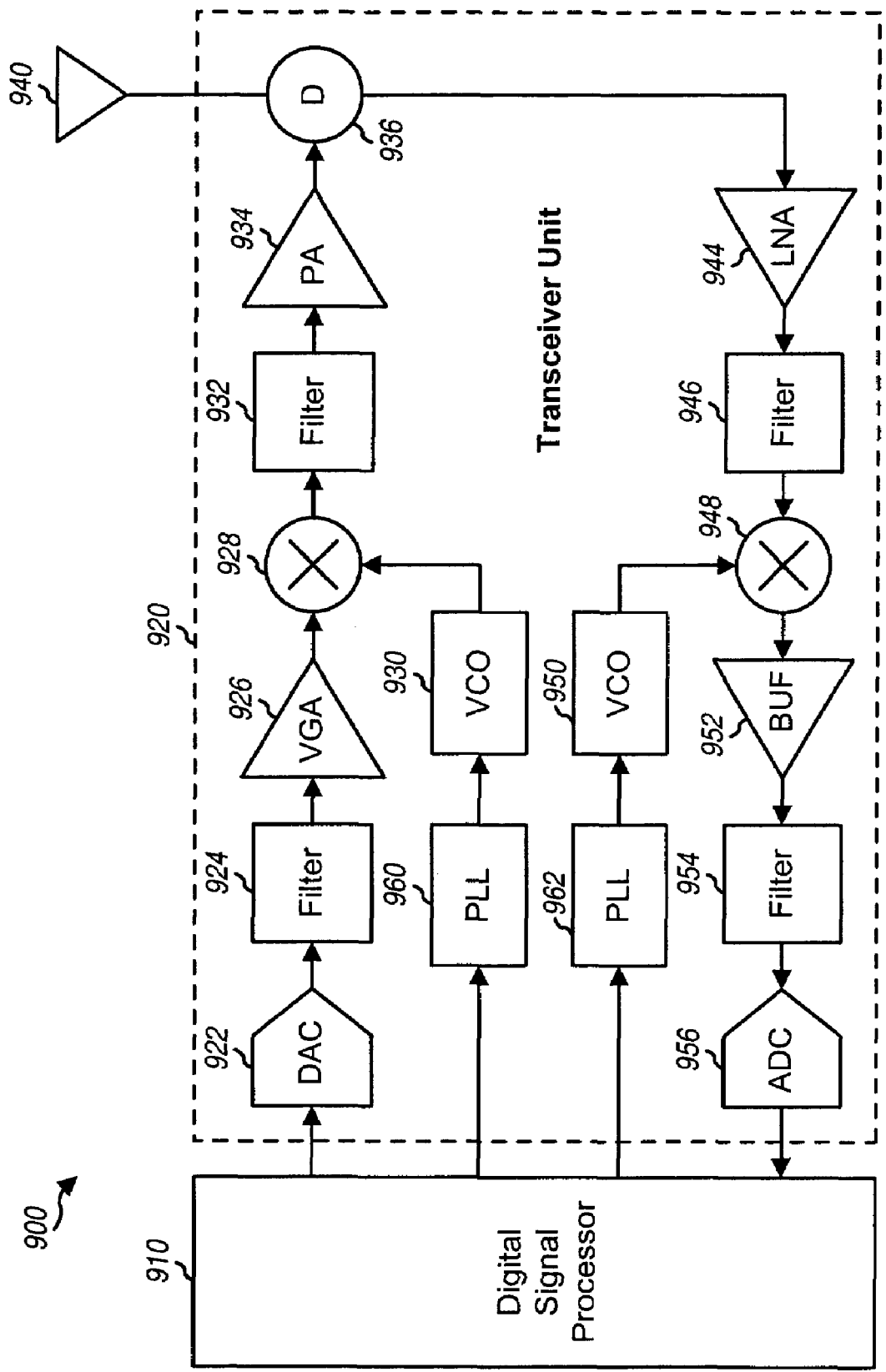
FIG. 9 shows a block diagram of a wireless device.

FIG. 9 shows a block diagram of a wireless device 900 that may be used for wireless communication. Wireless device 900 may be a cellular phone, a user terminal, a handset, or some other device or design. Wireless device 900 is capable of providing bi-directional communication via a transmit path and a receive path.

On the transmit path, a digital signal processor (DSP) 910 processes traffic data and provides a stream of chips to a transceiver unit 920. Within transceiver unit 920, one or more DACs 922 convert the stream of chips to one or more analog signals. The analog signal(s) are filtered by a filter 924, amplified by a variable gain amplifier (VGA) 926, and frequency upconverted from baseband to RF by a mixer 928 to generate an RF signal. The frequency upconversion is performed with an upconversion LO signal from a VCO 930. The RF signal is filtered by a filter 932, amplified by a power amplifier (PA) 934, routed through a duplexer (D) 936, and transmitted from an antenna 940.

On the receive path, a modulated signal is received by antenna 940, routed through duplexer 936, amplified by a low noise amplifier (LNA) 944, filtered by a filter 946, and frequency downconverted from RF to baseband by a mixer 948 with a downconversion LO signal from a VCO 950. The downconverted signal is buffered by a buffer 952, filtered by a filter 954, and digitized by one or more analog-to-digital converters (ADCs) 956 to obtain one or more streams of samples. The sample stream(s) are provided to digital signal processor 910 for processing.

FIG. 9 shows a specific transceiver design. In a typical transceiver, the signal conditioning for each path may be performed by one or more stages of amplifier, filter, mixer, and so on, as is known in the art. FIG. 9 only shows some of the circuit blocks that may be used for signal conditioning.

For the embodiment shown in FIG. 9, transceiver unit 920 includes two VCOs 930 and 950 for the transmit and receive paths, respectively. VCOs 930 and 950 may be implemented with various VCO designs, such as the design shown in FIG. 2. Each VCO may also be designed to operate at a specific frequency or a specific range of frequencies. For example, VCOs 930 and 950 may be designed to operate at an integer multiple of (e.g., two times) one or more of the following frequency bands:

Personal Communication System (PCS) band from 1850 to 1990 MHz,

Cellular band from 824 to 894 MHz,

Digital Cellular System (DCS) band from 1710 to 1880 MHz,

GSM900 band from 890 to 960 MHz,

International Mobile Telecommunications-2000 (IMT-2000) band from 1920 to 2170 MHz, and Global Positioning System (GPS) band from 1574.4 to 1576.4 MHz.

VCOs 930 and 950 may be designed to operate at multiple frequency bands by providing sufficient tuning capacitors in the programmable capacitor bank. A phase locked loop (PLL) 960 receives control information from DSP 910 and provides a control for VCO 930 to generate the upconversion LO signal. Similarly, a PLL 962 receives control information from DSP 910 and provides a control for VCO 950 to generate the downconversion LO signal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:
   a plurality of tuning elements, each tuning element comprising
   a first capacitor,
   a first switch coupled to the first capacitor and operable to electrically connect or disconnect the first capacitor to or from a first common node,
   a second switch coupled to the first switch and operable to provide a first bias voltage for the first switch, and
   a third switch coupled to the first switch and operable to provide a second bias voltage for the first switch, and
   wherein the first bias voltage or the second bias voltage for each tuning element is obtained via another tuning element.

2. The integrated circuit of claim 1, wherein the plurality of tuning elements are coupled in a ladder topology and are enabled in a sequential order starting from a first end of the ladder topology and concluding at a second end of the ladder topology.

3. The integrated circuit of claim 2, wherein for each tuning element, except for tuning elements at the first and second ends of the ladder topology, the second switch for the tuning element couples to a first adjacent tuning element and the third switch for the tuning element couples to a second adjacent tuning element, the first and second adjacent tuning elements being located on opposite sides of the tuning element.

4. The integrated circuit of claim 1, wherein each of the plurality of tuning elements further comprises
   a second capacitor coupled to the first switch for the tuning element, wherein the first switch is operable to electrically connect or disconnect the second capacitor to or from a second common node,
   a fourth switch coupled to the first switch and operable to provide the first bias voltage for the first switch, and
   a fifth switch coupled to the first switch and operable to provide the second bias voltage for the first switch.

5. The integrated circuit of claim 4, wherein the second and fourth switches for each tuning element are coupled to a source and a drain, respectively, of the first switch for the tuning element and are further coupled to a source and a drain, respectively, of the first switch for an adjacent tuning element.

6. The integrated circuit of claim 4, wherein the second and fourth switches for each tuning element are coupled to a source and a drain, respectively, of the first switch for the tuning element and are further coupled to a drain and a source, respectively, of the first switch for an adjacent tuning element.

7. The integrated circuit of claim 4, wherein the third and fifth switches for each tuning element are coupled to a source and a drain, respectively, of the first switch for the tuning element and are further coupled to a source and a drain, respectively, of the first switch for an adjacent tuning element.

8. The integrated circuit of claim 1, wherein each of the plurality of tuning elements further comprises
   a second capacitor coupled to the first switch for the tuning element, wherein the first switch is operable to electrically connect or disconnect the second capacitor to or from a second common node, and
   a fourth switch coupled to the first switch and operable to provide the first bias voltage for the first switch.

9. The integrated circuit of claim 8, wherein the second switch for each tuning element is coupled to a source of the first switch for the tuning element and is further coupled to a source of the first switch for an adjacent tuning element.

10. The integrated circuit of claim 8, wherein the second switch for each tuning element is coupled to a source of the first switch for the tuning element and is further coupled to a drain of the first switch for an adjacent tuning element.

11. The integrated circuit of claim 1, wherein a plurality of first capacitors for the plurality of tuning elements have equal capacitance.

12. The integrated circuit of claim 1, wherein a plurality of first capacitors for the plurality of tuning elements have different capacitances.

13. The integrated circuit of claim 1, wherein a plurality of first capacitors for the plurality of tuning elements have binary weight capacitances.

14. The integrated circuit of claim 1, wherein the first, second, and third switches for each tuning element are implemented with metal-oxide semiconductor (MOS) transistors.

15. The integrated circuit of claim 14, wherein the second switch is a P-channel MOS (P-MOS) transistor operable to provide a high bias voltage for the first switch, and wherein the third switch is an N-channel MOS (N-MOS) transistor operable to provide a low bias voltage for the first switch.

16. The integrated circuit of claim 1, wherein either the second switch or the third switch is enabled for each of the plurality of tuning elements.

17. The integrated circuit of claim 1, wherein the first, second, and third switches for each tuning element are operable to receive a control signal for the tuning element.

18. An integrated circuit comprising:
   a negative resistance element operable to provide negative resistance for an oscillator; and
   a capacitor bank coupled to the negative resistance element and comprising a plurality of tuning elements, each tuning element comprising
   a first capacitor,
   a first switch coupled to the first capacitor and operable to electrically connect or disconnect the first capacitor to or from a first common node of the oscillator,
   a second switch coupled to the first switch and operable to provide a first bias voltage for the first switch, and
   a third switch coupled to the first switch and operable to provide a second bias voltage for the first switch, and
   wherein the first bias voltage or the second bias voltage for each tuning element is obtained via another tuning element, and wherein oscillation frequency for the oscillator is adjusted by electrically connecting selected ones of a plurality of first capacitors for the plurality of tuning elements to the first common node.

19. The integrated circuit of claim 18, wherein each of the plurality of tuning elements further comprises
   a second capacitor coupled to the first switch for the tuning element, wherein the first switch is operable to electrically connect or disconnect the second capacitor to or from a second common node of the oscillator,
   a fourth switch coupled to the first switch and operable to provide the first bias voltage for the first switch, and
   wherein the oscillation frequency is further adjusted by electrically connecting selected ones of a plurality of second capacitors for the plurality of tuning elements to the second common node.

20. The integrated circuit of claim 18, wherein the plurality of first capacitors have equal capacitance.

21. The integrated circuit of claim 18, wherein the first, second, and third switches for each tuning element are implemented with metal-oxide semiconductor (MOS) transistors.

22. The integrated circuit of claim 18, further comprising:
a variable capacitor (varactor) coupled to the negative resistance element and operable to adjust the oscillation frequency.

23. The integrated circuit of claim 22, wherein the varactor has a size determined based on capacitance steps for the plurality of first capacitors.

24. A wireless device comprising:
a negative resistance element operable to provide negative resistance for an oscillator; and
a capacitor bank coupled to the negative resistance element and comprising a plurality of tuning elements, each tuning element comprising
a first capacitor,
a first switch coupled to the first capacitor and operable to electrically connect or disconnect the first capacitor to or from a first common node of the oscillator,
a second switch coupled to the first switch and operable to provide a first bias voltage for the first switch, and
a third switch coupled to the first switch and operable to provide a second bias voltage for the first switch, and
wherein the first bias voltage or the second bias voltage for each tuning element is obtained via another tuning element, and wherein oscillation frequency for the oscillator is adjusted by electrically connecting selected ones of a plurality of first capacitors for the plurality of tuning elements to the first common node.

25. The wireless device of claim 24, wherein the plurality of first capacitors have equal capacitance.

26. An apparatus comprising:
a negative resistance element operable to provide negative resistance for an oscillator; and
a capacitor bank coupled to the negative resistance element and comprising a plurality of tuning elements, each tuning element comprising
a first capacitor,
a first switch coupled to the first capacitor and operable to electrically connect or disconnect the first capacitor to or from a first common node of the oscillator,
a second switch coupled to the first switch and operable to provide a first bias voltage for the first switch, and
a third switch coupled to the first switch and operable to provide a second bias voltage for the first switch, and
wherein the first bias voltage or the second bias voltage for each tuning element is obtained via another tuning element, and wherein oscillation frequency for the oscillator is adjusted by electrically connecting selected ones of a plurality of first capacitors for the plurality of tuning elements to the first common node.

* * * * *